United States Patent [19]

Sakamoto et al.

[11] Patent Number: 5,257,067

[45] Date of Patent: Oct. 26, 1993

[54] APPARATUS FOR PLACING FILM MASK IN CONTACT WITH OBJECT

[75] Inventors: Haruo Sakamoto, Saitama; Shigeo Nagashima, Yokohama; Katuya Sangu, Tokyo, all of Japan

[73] Assignees: Adtec Engineering Co., Ltd., Tokyo; Canon Components Kabushiki Kaisha, Saitama, Japan

[21] Appl. No.: 797,133

[22] Filed: Nov. 22, 1991

[30] Foreign Application Priority Data

Dec. 26, 1990 [JP] Japan ................................. 2-414646

[51] Int. Cl.$^5$ ............................................. G03B 27/20
[52] U.S. Cl. ..................................................... 355/91
[58] Field of Search ................ 355/87, 91, 94; 430/22

[56] References Cited

U.S. PATENT DOCUMENTS

| | | | |
|---|---|---|---|
| 3,000,737 | 9/1961 | Barnhart | 430/22 |
| 3,615,474 | 10/1971 | Rosenburger | 430/22 |
| 3,667,845 | 6/1972 | Leavitt et al. | 355/91 |
| 3,794,486 | 2/1974 | Luther | 430/22 |

FOREIGN PATENT DOCUMENTS

| | | |
|---|---|---|
| 806838 | 12/1958 | United Kingdom . |
| 1282816 | 7/1972 | United Kingdom . |
| 1335434 | 10/1973 | United Kingdom . |
| 1577479 | 10/1980 | United Kingdom . |
| 2148520 | 5/1985 | United Kingdom . |

*Primary Examiner*—Richard A. Wintercorn
*Attorney, Agent, or Firm*—Nields & Lemack

[57] ABSTRACT

A film mask is abutted to the object at the one side thereof then a fluid is introduced at an other side of the film mask so as to press the film mask to be placed in contact with the object.

7 Claims, 5 Drawing Sheets

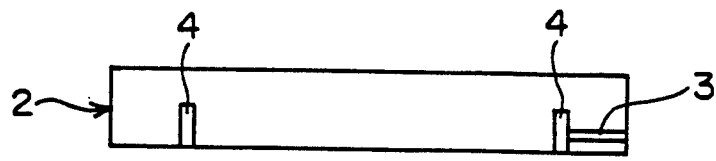
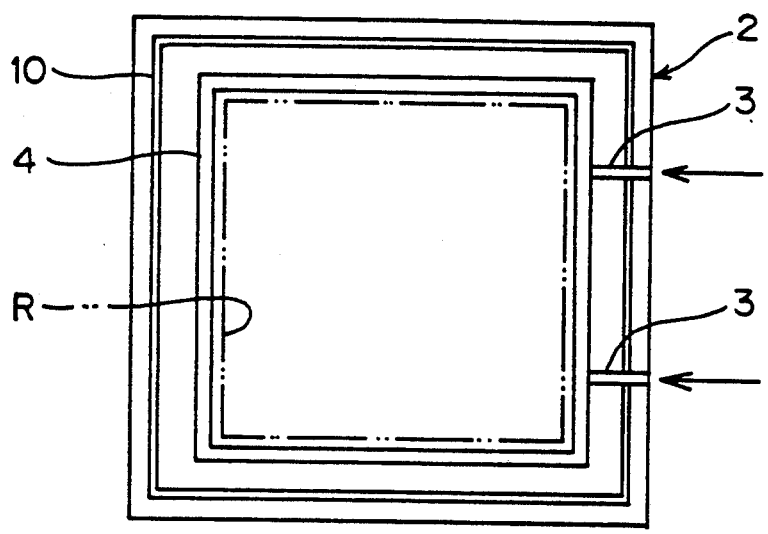
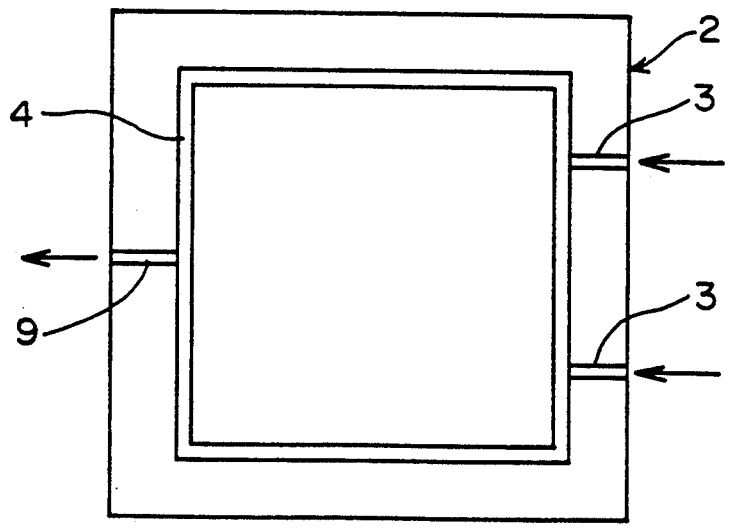

APPARATUS FOR PLACING FILM MASK IN CONTACT WITH OBJECT

FIELD OF THE INVENTION

The present invention relates to a method for placing film mask in contact with an object and an apparatus therefor, that is one of steps for producing print circuit boards.

BACKGROUND OF THE INVENTION

A photolithographic method has been utilized in a production of integrated circuits. Recently the photolithographic method is utilized in a production of the print circuit boards to form patterns of circuits on a board.

The photolithographic method utilizes an original plate on which the pattern to be printed is drawn and a light is supplied through the original plate on a print circuit board to form the same pattern as the plate thereon. Glass plates are used as the original plate in manufacturing integrated circuits because high accuracy is required. Film masks are usually utilized however in producing print circuit boards because rather low accuracy is allowable in this field.

When a film mask is employed as an original plate, it is very important to closely contact the film mask against the print circuit board. If the contact between the film masks and the board is incomplete the pattern projected on the board become incomplete. In particular the width of the pattern on the board become wider than the original pattern. In the prior art the gap between the film and the board is vacuumed after abutting them so that they can be closely contacted each other.

However it is difficult to substantially vacuum the gap so that the film is almost completely in contact with the board. Furthermore the cost for vacuuming is high and the apparatus therefor is complex and expensive.

SUMMARY OF THE INVENTION

An object of the invention is to provide a method and an apparatus which can almost completely bring the film mask into contact with the board.

A further object of the invention is to provide a method and an apparatus which can provide close contact between the film mask and the board at low cost.

In carrying out the invention in one preferred embodiment, a film mask is abutted to the object at the one side thereof. The object may be a print circuit board to be printed with the circuit pattern of the film mask. The film mask can be supported by a support made of transparent materials like as glass at the other side thereof. In the preferred embodiment, an air is induced the gap between the film mask and the support. The film mask is blown by the pressure of the induced air so as to be closely in contact with the print circuit board. The air may be cooled to prevent the extension of the film mask. The support may be provided with a groove for inducing the air uniformly.

In other preferred embodiment, the air in the gap is exhausted to keep the pressure of the gap at predetermined value and to prevent rising of the temperature of the induced air.

BRIEF DESCRIPTION OF THE DRAWINGS

FIG. 3 is a front view of the glass plate;
FIG. 4 is a plan view showing a position of a groove on the glass plate;
FIG. 5 is a plan view showing another embodiment of the invention.

DETAILED DESCRIPTION OF THE PREFERRED EMBODIMENTS

Figure 1:
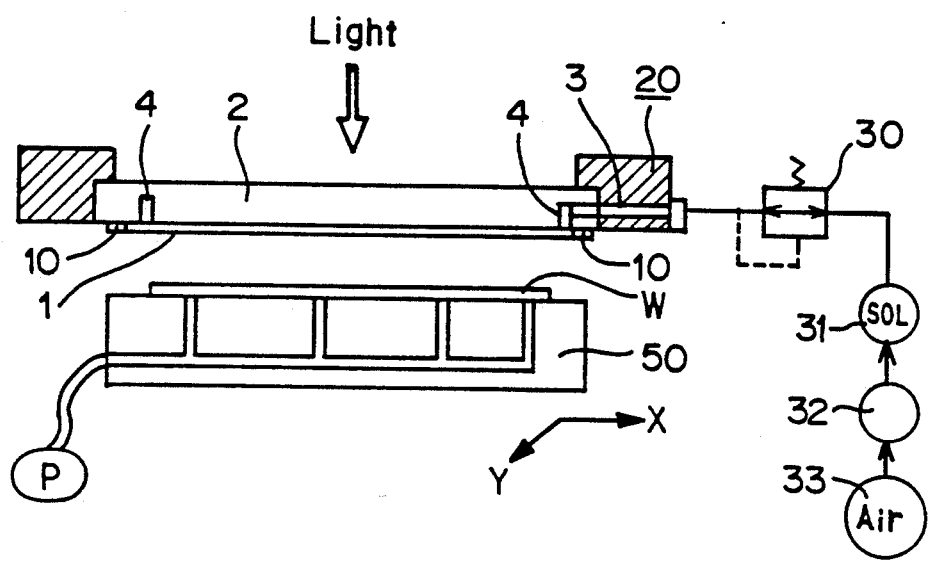
FIG. 1 is a schematic view showing one embodiment of the invention.

Now referring to FIG. 1, a print circuit board W is placed on a table 50 which is movable upwardly and downwardly so as to bring the print circuit board W into contact with a film mask 1. The position of the print circuit board W is adjusted on the table 50 so that a pattern formed on the film mask 1 is properly projected on the proper position thereof. The print circuit board W may be vacuumed on the table 50 as shown in FIG. 1.

The film mask 1 is stuck on the down side of a transparent body like as a glass plate 2 at the fringe thereof by an adhesive tape 10. The adhesive tape 10 may be arranged all over the fringe of the film mask 1 as shown in FIG. 4 or it may be arranged on the part of the fringe in order to let a fluid escape from a space between the film mask 1 and the glass plate 2 in order to reduce the pressure of the space.

Figure 2:
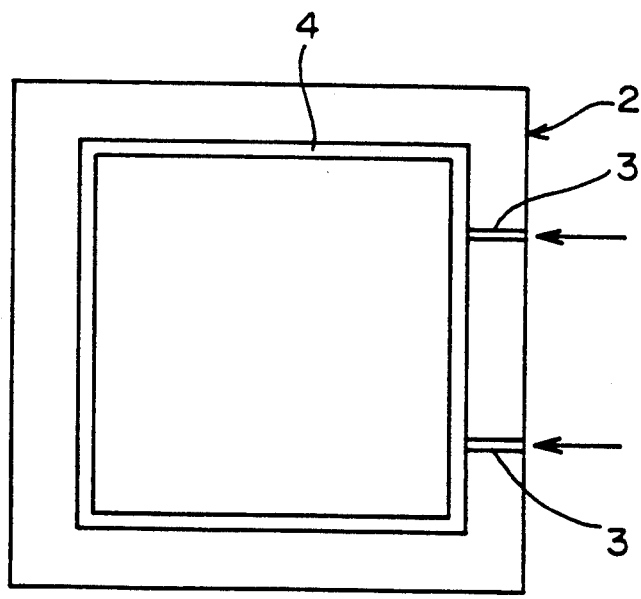
FIG. 2 is a plan view showing a glass plate.

The glass plate 2 is supported by a support frame 20 at the fringe thereof and is provided with air supplying hole 3. The air supplying hole 3 is formed in the support frame 20 and the glass plate 2. With this embodiment two air supplying holes 3, 3' are provided in parallel as shown in FIG. 2 and the air supplying holes 3 are connected to an air supply 33 through the side of the support frame 20. A cooler 32, a selector valve 31 and a pressure control valve 30 are installed between the air supply 33 and the holes 3. The glass plate 2 is provided with an air supplying groove 4 at the one surface facing to the film mask 1. The air supplying groove 4 is in a square circle shape and positioned inside of said adhesive tape 10 and outside of an exposure area R as shown in FIG. 4. The air supplying holes 3 are connected to the air supplying groove 4 so that the fluid from the air supply 33 is induced to the space formed between the glass plate 2 and the film mask 1 through the air supplying holes 3 and the air supplying groove 4. The cold air from the cooler 32 is supplied between the film mask 1 and the glass plate 2 at the pressure adjusted by the pressure control valve 30. The cold air cools the film mask 1 so as to prevent expansion of the film mask 1 with heat, which carry out a reliable exposure of the pattern.

The glass plate 2 may be replaced by other transparent materials like as an acrylic resin plate which can transmit the light from a projector (not shown) installed above the glass plate 2.

FIG. 5 shows another preferred embodiment where an exhaust hole 9 is added in order to exhaust the air between the film 1 and the glass plate 2. The exhaust hole 9 is also formed both in the glass plate 2 and the support frame 20 and connected to the air supplying groove 4 and to a suction apparatus (not shown). The diameter of the air supplying groove 4 is smaller than the air supplying hole 3. Therefore the air volume exhausted from the air supplying groove 4 is smaller than supplied from the air supplying hole 3 so that the pressure between the film mask 1 and the glass plate 2 can be kept at the predetermined pressure higher than atmospheric pressure. By using the exhaust hole 9 the air between the film mask 1 and the glass plate 2 is kept refreshed so that the film mask 1 is cooled to some extent.

Figure 6:
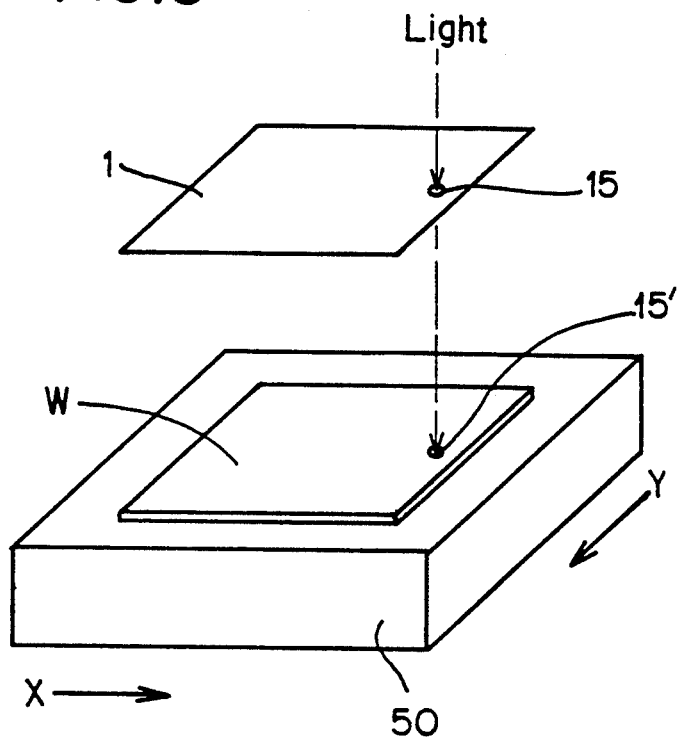
FIG. 6 is a perspective view showing a positioning operation.

As shown in FIG. 6, the film mask 1 has a sensing hole 15 for aligning on the print circuit board W which has a counter sensing hole 15'. The table 50 is movable in the X and Y directions to adjust the position of the film mask 1 and the print circuit board W using the sensing holes 15, 15'. In this embodiment, the light is utilized to identify the positions of the sensing holes 15 and 15'.

Figure 7:
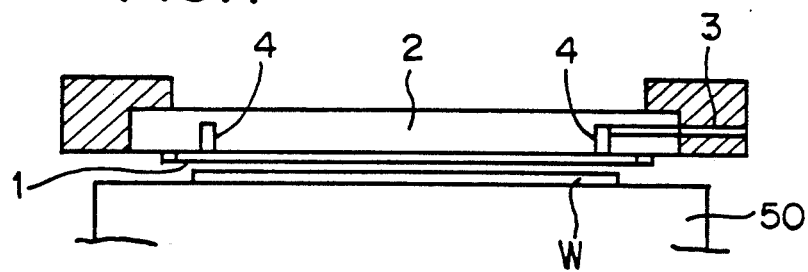
FIGS. 7 and 8 are front views showing one embodiment of the process of the invention.
Figure 8:
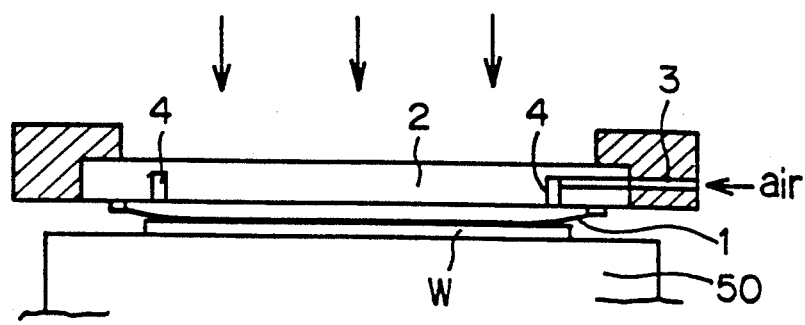

The print circuit board W is set on the table 50 at first, and the position of the print circuit board W and the film mask 1 is adjusted by moving the table 50. Then the table 50 is lifted up to abut the print circuit board W to the film mask 1 as shown in FIG. 7. The air is supplied at appropriate pressure from the air supply 33 through the cooler 32, the selector valve 31, the pressure control valve 30 and the air supplying hole 3. The air is induced into the air supplying groove 4 and diffused into the gap between the film mask 1 and the print circuit board W, which keeps the gap at the predetermined pressure higher than atmospheric pressure. The film mask 1 is blown up as shown in FIG. 8 by the air pressure and closely in contact with the print circuit board W. Then a light is applied from above the glass plate 2 so that the pattern on the film mask 1 is printed on the print circuit board W. The high accuracy of exposure is carried out because the film mask 1 is closely in contact with the print circuit board W. Furthermore the cooler 32 prevents the extension of the film mask 1, which also can carry out the high accuracy pattern exposure.

After the exposure is over, the table 50 is moved downwardly and the print circuit board W is picked up and sent to a development and etching process.

Figure 9:
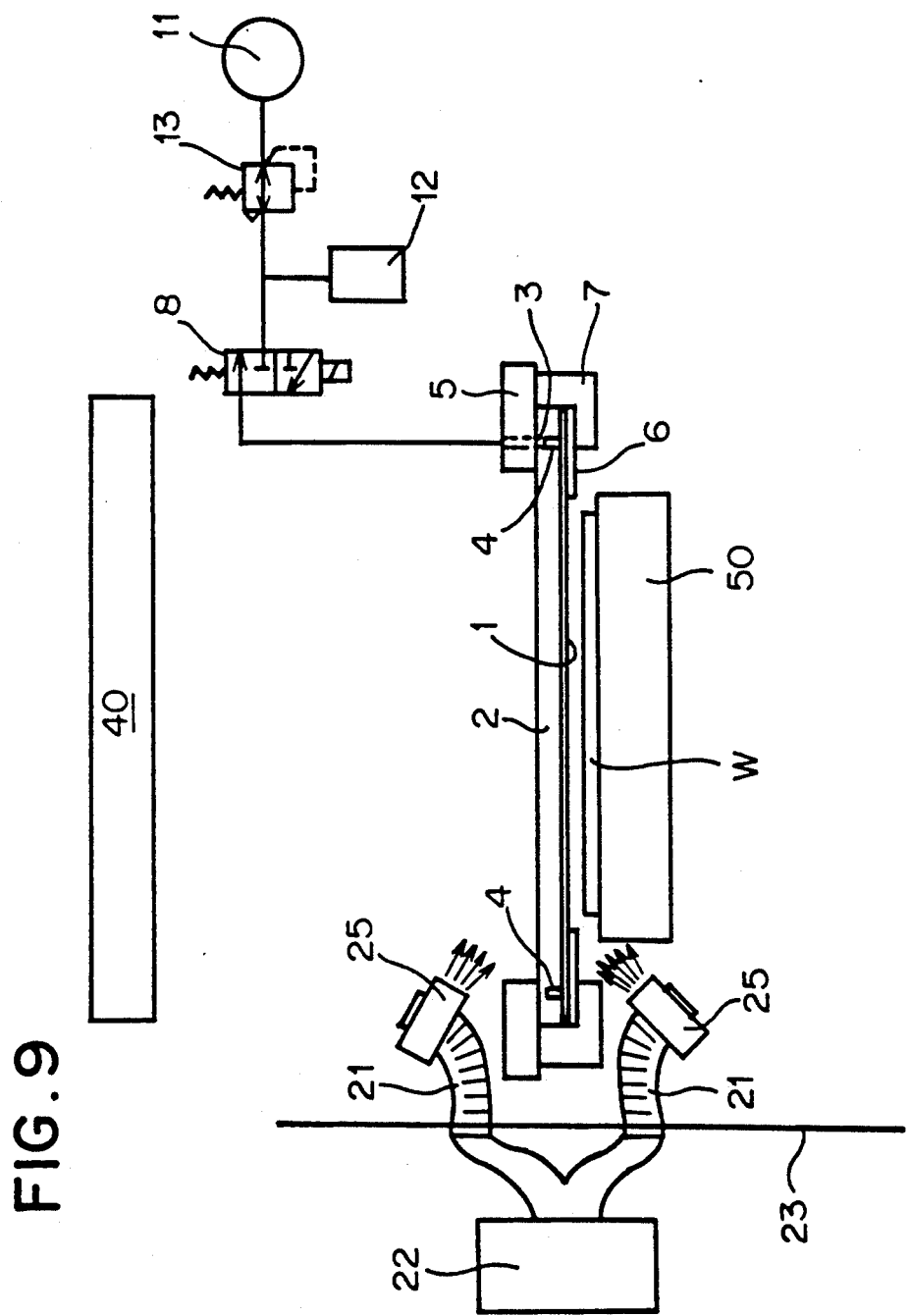
FIG. 9 is a schematic view showing another embodiment of the invention.

Another embodiment is shown in FIG. 9. In this embodiment the film mask 1 is secured on the glass plate 2 by virtue of a fastener 7 at the fringe of the film mask 1. The glass plate 2 is supported by a base frame 5 at the fringe thereof, and the air supplying hole 3 is formed through the base frame 5 and the glass plate 2. The air supplying hole 3 is connected to fluid source 11 through a switching valve 8, an accumulator 12 and a reducing control valve 13. The accumulator 12 prevents a rapid variation of the pressure of the fluid introduced into the gap between the film mask 1 and the glass plate 2, so that the film mask 1 and the glass plate 2 may be prevented from elongation and deformation thereof. Since the reducing control valve 13 can control linearly the pressure of the fluid induced into the air supplying hole 3, a precise control of the pressure can be rendered depending on the situation, for example a rapid press may be performed when starting and a moderate press is rendered at stable period. So the pressure of the fluid in the gap can be set at the most suitable condition at the most short time by using the accumulator 12. An exposure lighting apparatus 40 is installed above the glass plate 2.

Figure 10:
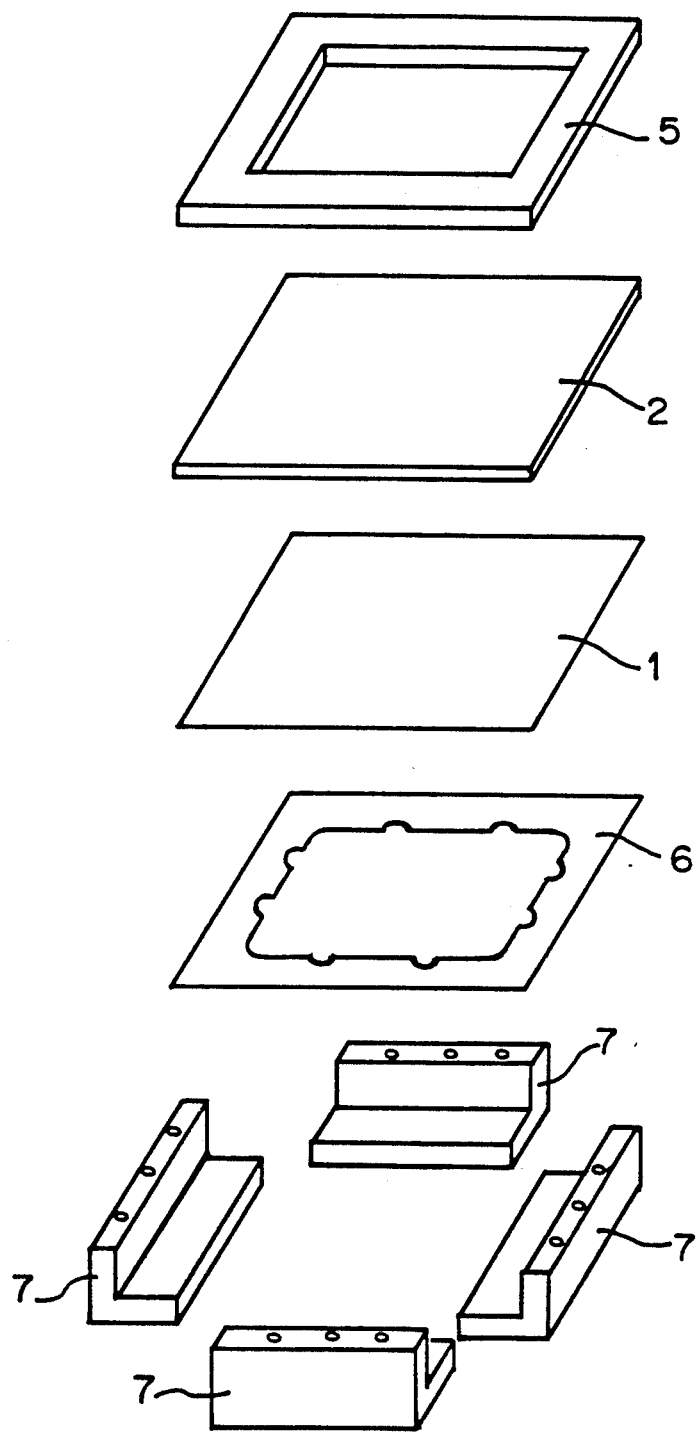
FIG. 10 is a perspective view showing a fastening construction.

A fastener 7 fastens the film mask 1 to the glass plate 2 using a mask press plate 6. The film mask press plate 6 is a frame of thin plate, the center part of which corresponding to the exposure area R is hollowed out. The plate 6 secures the fringe of the film mask 1 at even pressure by fastening of the fastener 7. As shown in FIG. 10, four pieces of the fastener 7 are provided at four sides of the film mask press plate 6 so as to clip the fringe of the film mask 1. The fastener 7 is mounted on the base frame 5 by bolts or the like so as to fasten the film mask press plate 6, film mask 1 and the glass plate 2.

The glass plate 2 and the film mask 1 are cooled by blowing of fans 25. The fans 25 supply the cooled air sent from an air cooler 22 through ducts 21. The cooled air can suppress elongation of the film mask 1. The air cooler 22 is furnished out of the cover 23 of the apparatus.

What is claimed is:

1. An apparatus for placing a film mask in contact with an object comprising:
    means for supporting a back side of a film mask,
    means for fastening said film mask to said supporting means at fringe thereof so as to secure said film mask to said supporting means,
    means for abutting a front side of the film mask to an object,
    means for introducing a fluid beteen the film mask and the means for supporting so as to press the film mask to be placed in contact with the object,
    said means for introducing a fluid having an accumulator 12 which prevents a rapid variation of the pressure of the fluid introduced into the gap between the film mask and the means for supporting, so that the film mask and the means for supporting are prevented from elogation and deformation.

2. An apparatus of claim 1 wherein:
    the fluid to be induced is air.

3. An apparatus of claim 1 wherein:
    said means for supporting is a transparent plate.

4. An apparatus of claim 1 wherein:
    said means for introducing a fluid continuously replaces the fluid keeping the fluid pressure to press the film mask.

5. An apparatus of claim 1 wherein:
    said means for introducing a fluid keeps the temperature of the fluid at the predetermined value.

6. An apparatus of claim 1 wherein:
    said means for introducing a fluid includes a means for controlling the pressure of said fluid.

7. An apparatus of claim 1 further comprising;
    means for blowing cooled fluid to said film mask and/or to said glass plate.

* * * * *